United States Patent
Ono et al.

(10) Patent No.: US 7,924,116 B2
(45) Date of Patent: Apr. 12, 2011

(54) DIPLEXER AND MULTIPLEXER USING THE SAME

(75) Inventors: Syouji Ono, Ise (JP); Tetsuo Suehiro, Komaki (JP); Jyunichi Ichikawa, Kagamigahara (JP); Keiji Takagi, Iwakura (JP); Manabu Sato, Nagoya (JP)

(73) Assignee: NGK Spark Plug Co., Ltd., Nagoya, Aichi (JP)

( * ) Notice: Subject to any disclaimer, the term of this patent is extended or adjusted under 35 U.S.C. 154(b) by 0 days.

(21) Appl. No.: 12/017,975

(22) Filed: Jan. 22, 2008

(65) Prior Publication Data

US 2008/0174386 A1 Jul. 24, 2008

(30) Foreign Application Priority Data

Jan. 23, 2007 (JP) .................................. 2007-012789

(51) Int. Cl.
*H01P 5/12* (2006.01)
(52) U.S. Cl. ......... 333/126; 333/129; 333/132; 333/134
(58) Field of Classification Search .......... 333/126–129, 333/132, 134
See application file for complete search history.

(56) References Cited

U.S. PATENT DOCUMENTS

| | | | | |
|---|---|---|---|---|
| 5,379,294 A * | 1/1995 | Ohtake et al. | ............... | 370/295 |
| 5,404,118 A * | 4/1995 | Okamura et al. | ............. | 333/175 |
| 5,826,167 A | 10/1998 | Jelinek et al. | | |
| 6,249,687 B1 | 6/2001 | Thomsen et al. | | |
| 6,366,564 B1 | 4/2002 | Hiraka et al. | | |
| 6,414,567 B2 | 7/2002 | Matsumura et al. | | |
| 6,683,513 B2 * | 1/2004 | Shamsaifar et al. | .......... | 333/135 |
| 6,759,926 B2 | 7/2004 | Yamaguchi | | |
| 7,116,186 B2 * | 10/2006 | Chen | ............................. | 333/126 |
| 2006/0145782 A1 | 7/2006 | Liu et al. | | |

FOREIGN PATENT DOCUMENTS

| | | |
|---|---|---|
| JP | 06-120703 | 4/1994 |
| JP | 06112735 | 4/1994 |
| JP | 11068499 | 3/1999 |
| JP | 11-251856 | 9/1999 |
| JP | 11266133 | 9/1999 |
| JP | 2000-151206 | 5/2000 |

(Continued)

OTHER PUBLICATIONS

Orlenko et al, Novel High-Rejection LTCC Diplexers for Dual-Band WILAN Applications, Jun. 1997, pp. 727-730, 2005 IEEE, Microwave Symposium Digest.

(Continued)

*Primary Examiner* — Robert Pascal
*Assistant Examiner* — Kimberly E Glenn
(74) *Attorney, Agent, or Firm* — Stites & Harbison PLLC; Jeffrey A. Haeberlin

(57) ABSTRACT

A diplexer provides a high degree of design freedom for satisfying the requirements of electric characteristics so as to realize desired characteristics and at the same time can be downsized and a multiplexer is realized by using such a diplexer. The diplexer includes a filter having a first pass band and a filter having a second pass band with a frequency band at least twice as high as the frequency band of the first pass band, the filter having the first pass band being a filter of the lumped constant type, the filter having the second pass band being a filter of the distributed constant type.

11 Claims, 8 Drawing Sheets

FOREIGN PATENT DOCUMENTS

| | | |
|---|---|---|
| JP | 2001-168669 | 6/2001 |
| JP | 2004248121 | 9/2004 |
| JP | 2005-079657 | 3/2005 |
| JP | 2005277516 | 10/2005 |
| JP | 2006-211057 | 8/2006 |
| JP | 2006332980 | 12/2006 |

OTHER PUBLICATIONS

Lim and Park, A modified Chebyshev Bandpass Filter with Attenuation Poles in the Stopband, Jun. 1997, pp. 898-904, vol. 45, No, 6, IEEE Transaction on Microwave Theory and Techniques.

* cited by examiner

DIPLEXER AND MULTIPLEXER USING THE SAME

BACKGROUND OF THE INVENTION

1. Field of the Invention

The present invention relates to a diplexer that can find applications in mobile communication apparatus adapted to operate with microwaves and also to a multiplexer using the same. More particularly, the present invention relates to a diplexer and a multiplexer that have a high-frequency side pass band at or near 5 GHz and are required to secure attenuation in a frequency domain not lower than 10 GHz as in the case of WiFi. WiFi (Wireless Fidelity) is a technology brand invented to improve the consumers' recognition of the "IEEE802.11a/IEEE802.11b" standards for wireless LANs. IEEE802.11a is one of the standards established for LAN technologies by the 802 Committee of IEEE that provides specifications for wireless communications at about 54 Mbps in the 5.2 GHz band. In Japan, 5.15 GHz to 5.25 GHz are assigned to high speed wireless LANs. IEEE802.11b is a standard providing specifications for wireless communications at about 11 Mbps in the 2.4 GHz band.

2. Description of the Related Art

There are known separators prepared for band separation in dual band portable phones that can operate for communications by way of two frequency bands and by means of a single potable terminal by integrally laying ceramic insulating layers to produce a laminate and forming therein a first notch circuit having a parallel circuit of an inductance and a capacitance and a second notch circuit also having a parallel circuit of an inductance and a capacitance, the line width of the inductance of the high-frequency side second notch circuit being made grater than the line width of the inductance of the first notch circuit, for the purpose of downsizing, while maintaining the characteristics of the separator (see Patent Document 1: Jpn. Pat. Appln. Laid-Open Publication No. 11-68499).

Similar separators that can be easily downsized with a small loss and includes a low-frequency side first filter, which is a low pass filter equipped with an attenuation pole, and a high-frequency side second filter, which is a high pass filter also equipped with an attenuation pole, one of the input/output ports of the first and second filters being made to operate as common port, are also known (see Patent Document 2: Jpn. Pat. Appln. Laid-Open Publication No. 11-266133).

Furthermore, separators including a first filter and a second filter having respective center frequencies that are different from each other, and a separation circuit, where the separation circuit has capacitors respectively connected to the first filter and the second filter in series and inductors respectively connected to the first filter and the second filter in parallel, are known (see Patent Document 3: Japanese Patent No. 3,204,753).

Separators as described in the above cited Patent Documents 1 and 2 have a functional feature of diplexer by forming an LC circuit element in a multilayer structure. Basically, both of them are provided with a feature of a filter and a feature of matching the high-frequency side with the low-frequency side by combining the function of a low pass filter and that of a high pass filter. Such filters are formed by using an inductor and a capacitor that are lumped constant elements and hence referred to as lumped constant type filters.

While lumped constant type filters have an advantage that it is not necessary to additionally incorporate a special matching circuit and a relatively high degree of freedom is provided for setting the attenuation pole position because the attenuation pole is produced by an LC resonator, they are accompanied by a disadvantage that resonance peaks appear to reduce the impedance of each lumped constant element to nil in the high-frequency domain where the element gives rise to self resonance to consequently deteriorate the attenuation. Thus, it is necessary to add an attenuation circuit in order to enhance the attenuation characteristic, ending up in an increased number of necessary circuit elements, which by turn obstructs the attempt to downsize the product. Additionally, the number of self resonance peaks increases as the number of circuit elements rises to further deteriorate the attenuation characteristic in the higher harmonic domain.

Furthermore, from the material point of view, materials showing a relatively low dielectric constant will have to be selected to meet the requirement of forming an ideal inductor. A technique of laying a low dielectric constant material and a high dielectric constant material one on the other to form a laminate has been publicized recently so that an inductor may be formed in a region formed by the low dielectric constant material while a capacitor may be formed in a region formed by the high dielectric constant material for the purpose of achieving improved electric characteristics.

Meanwhile, according to Patent Document 3, a filter is formed by using a $\lambda/4$ line having a short-circuited side and an open side as resonator and the functional feature of a diplexer is realized by combining two filters and a separator circuit (matching circuit) A filter of the type formed by using a $\lambda/4$ line is referred to as distributed constant type filter because it exploits the characteristics attributable to the profiles of the elements.

While a distributed constant type filter generally can achieve higher electric characteristics particularly in terms of attenuation with an arrangement simpler than a lumped constant type filter, it requires a separator circuit (matching circuit) because a diplexer cannot be realized simply by connecting two filters.

Additionally, from the material point of view, a material having a higher dielectric constant is preferably employed for the purpose of downsizing because the resonance frequency is determined by the length of the $\lambda/4$ line and the dielectric constant of the material.

As described above, while combinations of lumped constant type elements and those of distributed constant type elements have been proposed to date, no proposal has ever been made to combine a lumped constant type element and a distributed constant type element. The reason for this may apparently be that it is necessary to form a very large resonance element ($\lambda/4$ line) in order to reduce the resonance frequency by means of the distributed constant type when a material showing a low dielectric constant is employed, whereas the self resonance frequency of the inductor of the lumped constant type becomes low to consequently narrow the frequency domain necessary for operating as inductor and the attenuation characteristic of higher harmonics is degraded by the self resonance peaks when a material showing a high dielectric constant is employed.

When combining lumped constant type filters and distributed constant type filters, using the technique of laying different materials, combining a high dielectric constant material and a low dielectric constant material, both the lumped constant type filters and the distributed constant type filters need to be laid to form a laminate so that the thicknesses of sheet allocated to the respective types are relatively reduced to give rise to a problem of a reduced distance separating the ground and the inductor particularly of the lumped constant type to consequently degrade the insertion loss.

SUMMARY OF THE INVENTION

In view of the above-identified problems of the prior art, it is therefore the object of the present invention to provide a diplexer that ensures a high degree of design freedom for satisfying the requirements of electric characteristics so as to realize desired characteristics and at the same time can be downsized and also a multiplexer realized by using such a diplexer.

In an aspect of the present invention, the above object is achieved by providing a diplexer including: a filter having a first pass band; and a filter having a second pass band with a center frequency at least twice as high as the center frequency of the first pass band; the filter having the first pass band being a filter of the lumped constant type; the filter having the second pass band being a filter of the distributed constant type.

In the diplexer according to the present invention as defined above, the filter of the lumped constant type having the first pass band may be a band pass filter formed by connecting a low pass filter and a high pass filter in series and the filter of the distributed constant type having the second pass band may be a band pass filter.

The resonator of the band pass filter of the distributed constant type having the second pass band may include an inductor formed in a multilayer substrate and linking itself to a via conductor formed along the laminating direction of the multilayer substrate and an electrode capacitive-coupled to a grounding electrode. Additionally, the resonator of the band pass filter of the distributed constant type having the second pass band may include an inductor electrode having a bent section. The inductor electrode having a bent section may show a profile at least selected from a spiral profile, a U-shaped profile, a meandering profile and an arc-shaped profile.

The band pass filter of the distributed constant type having the second pass band may be capacitive-coupled to a common terminal. In another embodiment, the band pass filter of the distributed constant type having the second pass band may be connected to a common terminal by way of an LC parallel resonance circuit.

The resonator of the band pass filter of the distributed constant type having the second pass band may be connected to a short circuit terminal formed at the side of the surface located vis-à-vis the mounting surface of the multilayer substrate.

The filter of the lumped constant type having the first pass band may be connected to a common terminal by way of an inductor electrode.

According to the present invention, there is also provided a multiplexer including at least a lumped constant type filter and a distributed constant type filter and adapted to separate and couple a plurality of bands.

Thus, since a diplexer according to the present invention includes a filter having a first pass band and a filter having a second pass band with a center frequency at least twice as high as the center frequency of the first pass band, the filter having the first pass band being a filter of the lumped constant type, the filter having the second pass band being a filter of the distributed constant type, it is possible to provide a broader choice of types and a higher degree of design freedom to meet the requirements of electric characteristics. Additionally, since the second pass band is at the higher frequency side relative to the first pass band and the filter having the lower frequency side first pass band is of the lumped constant type, whereas the filter having the higher frequency side second pass band is of the distributed constant type, the length of the resonance element of the distributed constant type filter is determined as a function of its resonance frequency so that it is possible to downsize the diplexer when it is so designed as to be applied to a higher frequency domain. Still additionally, since the center frequency of the second pass band is at least twice as high as the center frequency of the first pass band, it is possible to reduce the length of the resonance element necessary for making a filter of the distributed constant type out of the filter having the second pass band and allowing the use of a low dielectric constant material for it. Then, as a result, it is advantageously possible to form the filter of the lumped constant type having the first pass band in an ideal manner.

In the diplexer according to the present invention, the filter of the lumped constant type having the first pass band may be a band pass filter formed by connecting a low pass filter and a high pass filter in series and the filter of the distributed constant type having the second bass band may also be a band pass filter. Then, as a result of using such band pass filters, the diplexer according to the present invention provides an advantage of allowing the number of filter elements arranged downstream relative to the diplexer and hence the number of parts of the entire high-frequency side to be reduced so as to pave the way for downsizing. Additionally, when the attenuation of the diplexer is enhanced, it provides an advantage of improving the filter characteristics even if the attenuation of the downstream filters is small. Still additionally, it is possible to eliminate some of the downstream filters and reduce the number of downstream filters by enhancing the attenuation of the diplexer. Then, as a result, it is possible to provide laminate LC parts at low cost.

In the diplexer according to the present invention, the resonator of the band pass filter of the distributed constant type having the second pass band may include a inductor formed in a multilayer substrate and linking itself to a via conductor formed along the laminating direction of the multilayer substrate and an electrode capacitive-coupled to a grounding electrode. Then, as a result of utilizing the via conductor extending along the laminating direction for the inductor, the diplexer according to the present invention provides an advantage that the magnetic field generated by the inductor is made to extend along a plane that runs in parallel with the dielectric layer without running through the grounding electrode and hence without generating any eddy current. The net result will be that there is no risk of aggravating the insertion loss.

In the diplexer according to the present invention, the resonator of the band pass filter of the distributed constant type having the second pass band may include a inductor formed in a multilayer substrate and linking itself to a via conductor formed along the laminating direction of the multilayer substrate, an electrode capacitive-coupled to a grounding electrode and an inductor electrode having a bent section. Then, as a result, the frequency can be adjusted more finely not only by adjusting the center frequency by way of the capacitive-coupling relative to the grounding electrode but also adjusting the length of the inductor electrode having the bent section. The inductor electrode having a bent section may show a profile at least selected from a spiral profile, a U-shaped profile, a meandering profile and an arc-shaped profile. When the inductor electrode having the bent section is formed by connecting the opposite ends of the inductor electrodes by way of the via conductor and winding it in the laminating direction of the laminate, it is possible to adjust the length of the inductor electrode without increasing the dimensions of the final product.

In the diplexer according to the present invention, the band pass filter of the distributed constant type having the second pass band may be capacitive-coupled to a common terminal. Then, as a result, the capacitive-coupled capacitor shows such characteristics that it intercepts signals of the low-frequency domain and passes signals of the high-frequency domain to provide an advantage of matching without requiring an independent separator circuit.

In the diplexer according to the present invention, the band pass filter of the distributed constant type having the second pass band may be connected to a common terminal by way of an LC parallel resonance circuit. Then, as a result, it is possible to make the resonance frequency of the LC parallel resonance circuit agree with the first frequency and allow the LC parallel resonance circuit to operate as matching circuit.

In the diplexer according to the present invention, the filter of the lumped constant type having the first pass band may be connected to a common terminal by way of an inductor electrode. Then, as a result, an inductor electrode shows such characteristics that it passes signals of the low-frequency domain and intercepts signals of the high-frequency domain to provide an advantage of matching without requiring an independent separator circuit.

According to the present invention, it is possible to provide a triplexer or a multiplexer having more than three filters by combining at least one or more than one lumped constant type filters and one or more than one distributed constant type filters.

DETAILED DESCRIPTION OF THE PREFERRED EMBODIMENTS

Now, the present invention will be described in greater detail below by referring to the accompanying drawings that illustrate preferred embodiments of the invention.

Figure 1:
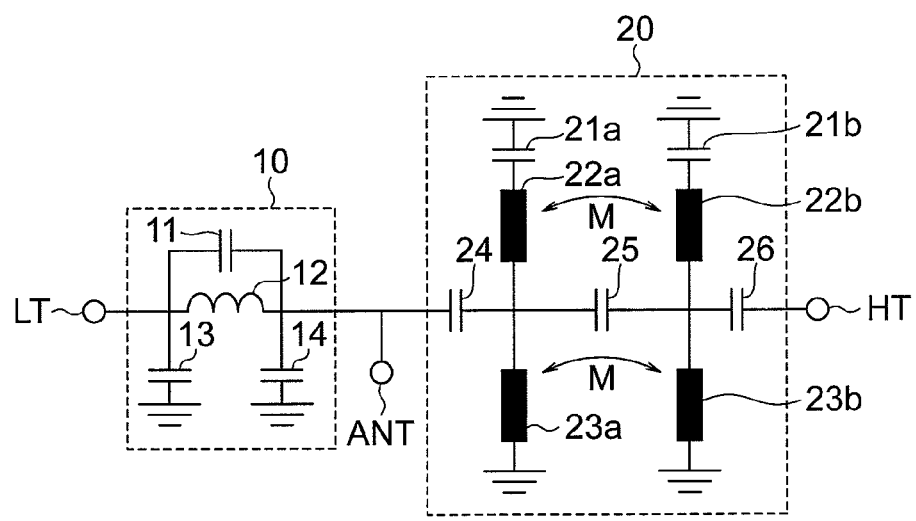
FIG. 1 is a schematic circuit diagram of diplexer according to an embodiment of the present invention, showing the circuit configuration thereof.

FIG. 1 is a schematic circuit diagram of an embodiment of diplexer according to the present invention, showing the circuit configuration thereof. In the circuit of FIG. 1, reference symbol 10 denotes a low pass filter of the lumped constant type having the first pass band and reference symbol 20 denotes a band pass filter of the distributed constant type having the second pass band. The low pass filter 10 of the lumped constant type includes a parallel resonance circuit of a capacitor 11 and an inductor 12 and the circuit parameters of the resonance circuit are so selected that it resonates in the second pass band. The resonance circuit generates an attenuation pole in the second pass band. One of the opposite ends of the parallel resonance circuit of the capacitor 11 and inductor 12 is connected to low-frequency side terminal LT and grounded by way of a capacitor 13. The other end of the parallel resonance circuit of the capacitor 11 and the inductor 12 is connected to an antenna terminal, or common terminal ANT, and grounded by way of a capacitor 14.

The band pass filter 20 of the distributed constant type has two resonant lines. One of the resonant lines is formed by a capacitor 21a and resonance elements 22a, 23a, whereas the other resonant line is formed by a capacitor 21b and resonance elements 22b, 23b. The connection point of the resonance elements 22a, 23a of one of the resonant lines is connected to the common terminal ANT by way of a capacitor 24 and also to the connection point of the resonance elements 22b, 23b of the other resonant line by way of a capacitor 25, the latter connection point being connected to high-frequency side terminal HT by way of a capacitor 26. The resonance element 23a of the former resonant line is grounded. Similarly, the resonance element 23b of the other resonance line is grounded. The band pass filter 20 of the distributed constant type has two serial resonance circuits and one of the serial resonance circuits is formed by the capacitor 21a and the resonance element 22a, whereas the other serial resonance circuit is formed by the capacitor 21b and the resonance element 22b. The serial resonance circuits operate to generate an attenuation pole at the high-frequency side of the pass band. The reference symbols M in FIG. 1 respectively indicate the inductive coupling between the resonance elements 22a, 22b and the inductive coupling between the resonance elements 23a, 23b. The magnitude of each of the inductive couplings can be defined by the gap separating the related resonance elements.

Figure 2:
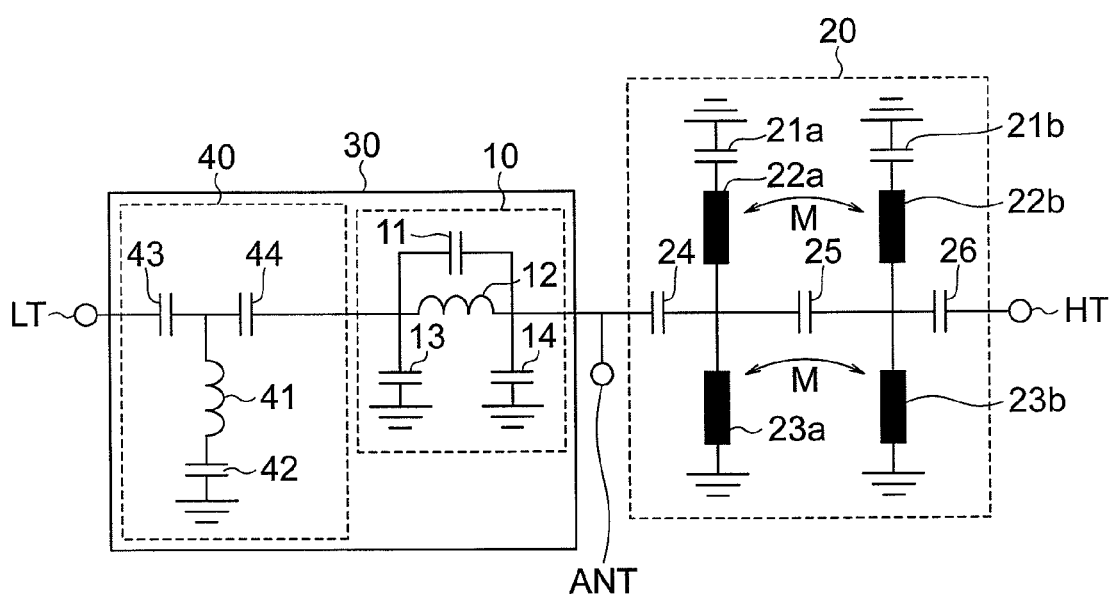
FIG. 2 is a schematic circuit diagram of diplexer according to another embodiment of the present invention, showing the circuit diagram thereof.

FIG. 2 is a schematic circuit diagram of another embodiment of diplexer according to the present invention, showing the circuit diagram thereof. In FIG. 2, the circuit components similar to those of FIG. 1 are denoted respectively by the same reference symbols.

In the circuit of FIG. 2, reference symbol 30 denotes a band pass filter of the lumped constant type having the first pass band and is formed by a low pass filter 10 of the lumped constant type and a high pass filter 40 of the lumped constant type. The high pass filter 40 of the lumped constant type includes a serial resonance circuit of an inductor 41 and a capacitor 42. One of the opposite ends of the serial resonance circuit is grounded by way of the capacitor 42, while the other end thereof is connected to low-frequency side terminal LT by way of a capacitor 43 and also to one of the opposite ends of the parallel resonance circuit of the capacitor 11 and the inductor 12 of the low pass filter 10 of the lumped constant type by way of a capacitor 44. The other end of the parallel resonance circuit is connected to common terminal ANT. The low pass filter 10 of the lumped constant type having the first pass band has a circuit configuration same as its counterpart of FIG. 1. In other words, the low pass filter 10 of the lumped constant type includes the parallel resonance circuit of the capacitor 11 and the inductor 12 and the circuit parameters of the resonance circuit are so selected that it resonates in the second pass band. The resonance circuit generates an attenuation pole in the second pass band.

The band pass filter 20 of the distributed constant type has a circuit configuration similar to its counterpart of FIG. 1. In other words, the band pass filter 20 of the distributed constant type has two resonant lines. One of the resonant lines is formed by a capacitor 21a and resonance elements 22a, 23a, whereas the other resonant line is formed by a capacitor 21b and resonance elements 22b, 23b. The connection point of the resonance elements 22a, 23a of one of the resonant lines is connected to the common terminal ANT by way of a capacitor 24 and also to the connection point of the resonance elements 22b, 23b of the other resonant line byway of a capacitor 25, the latter connection point being connected to high-frequency side terminal HT by way of a capacitor 26. The resonance element 23a of the former resonant line is grounded. Similarly, the resonance element 23b of the other resonance line is grounded. The band pass filter 20 of the distributed constant type has to two serial resonance circuits and one of the serial resonance circuits is formed by the capacitor 21a and the resonance element 22a, whereas the other serial resonance circuit is formed by the capacitor 21b and the resonance element 22b. The serial resonance circuits operate to generate an attenuation pole at the high-frequency side of the pass band.

Figure 3:
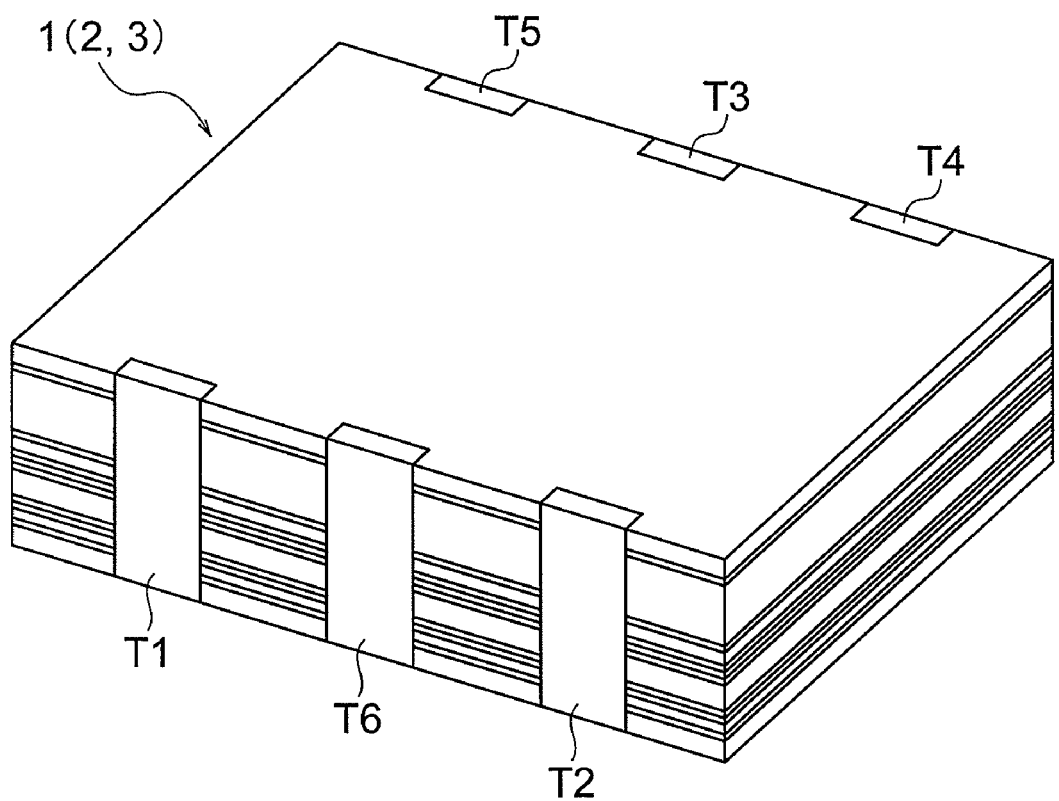
FIG. 3 is a schematic perspective view of a diplexer according to the present embodiment, showing the appearance thereof.
Figure 4:
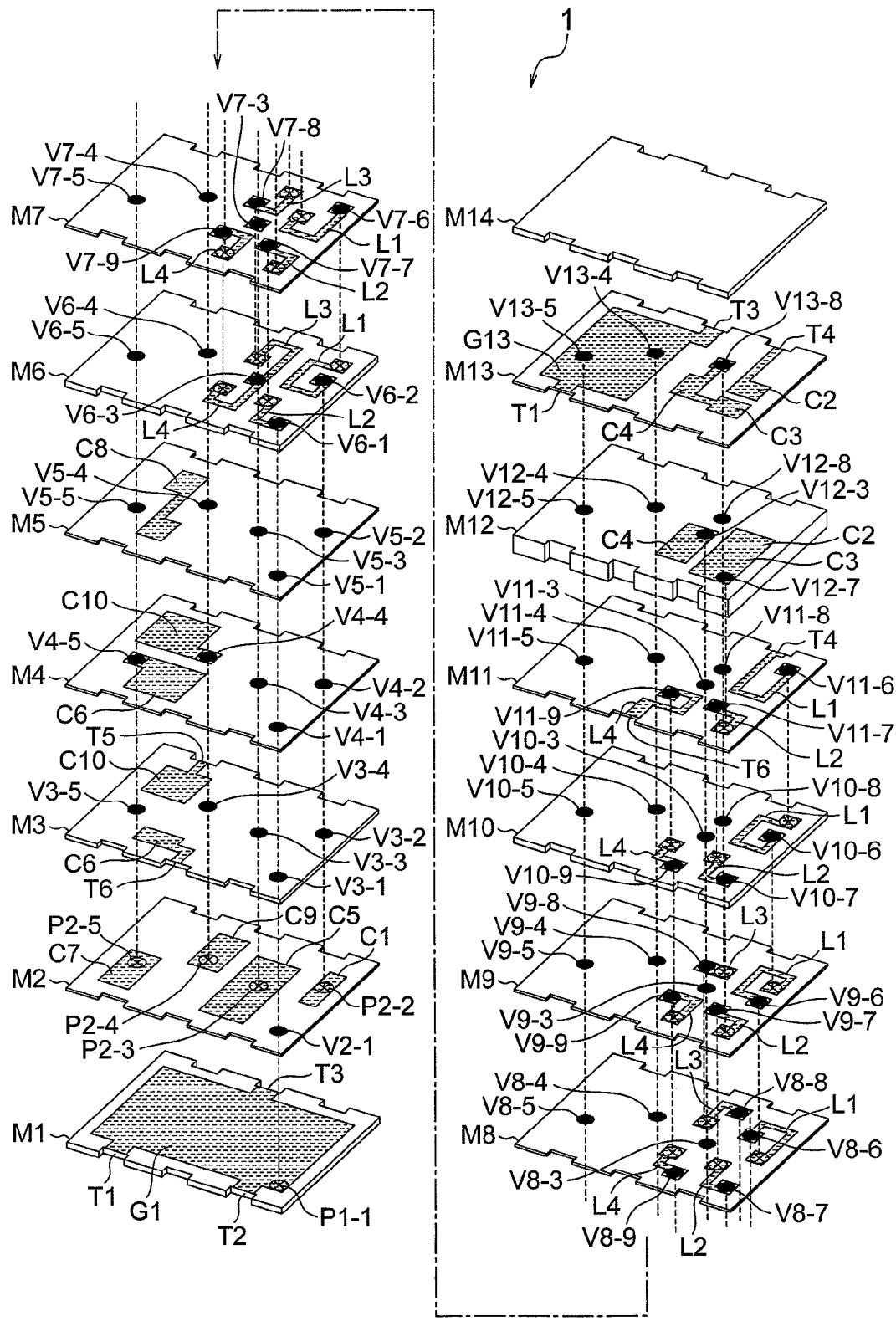
FIG. 4 is an exploded schematic perspective view of the embodiment of FIG. 1.
Figure 5:
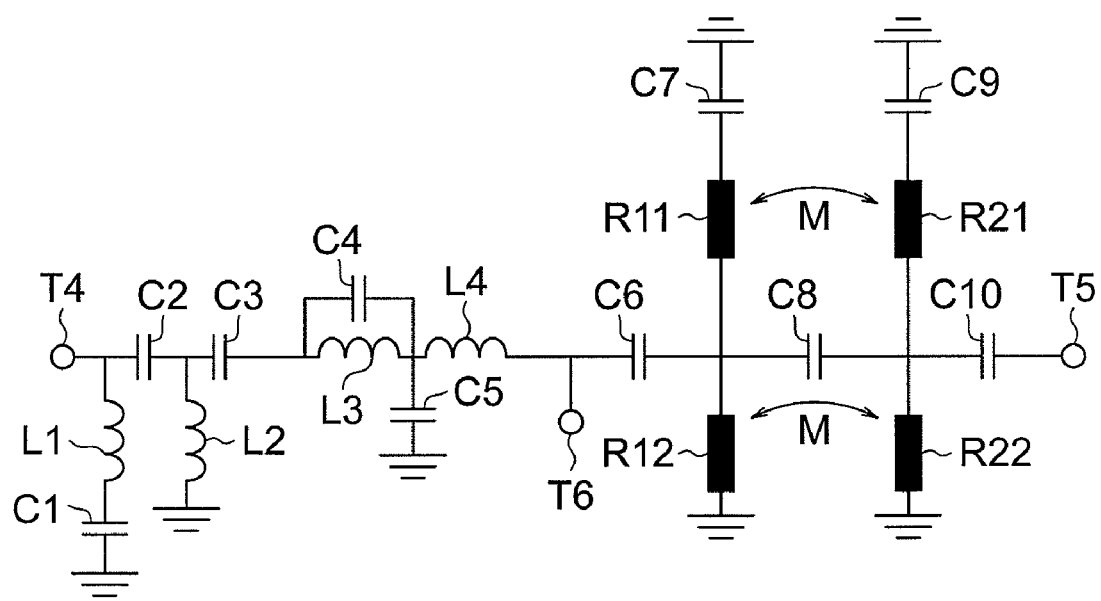
FIG. 5 is a schematic circuit diagram of the equivalent circuit of the diplexer of FIG. 4.

FIG. 3 is a schematic perspective view of a diplexer according to the present invention, showing the appearance thereof. Referring to FIG. 3, the diplexer 1 (or 2 or 3) is formed by a multilayer substrate prepared by laying a total of fourteen dielectric layers one on the other and has dimensions including a length of about 2.0 mm, a width of about 2.5 mm and a height of about 0.85 mm. The diplexer has grounding terminals T1 through T3, a low-frequency side terminal T4, a high-frequency side terminal T5 and an antenna terminal, or common terminal T6. FIGS. 4 and 5 illustrate the embodiment of diplexer 1 of FIG. 1. The illustrated diplexer 1 is formed by a multilayer substrate that is prepared by laying a plurality of dielectric layers (fourteen in the case of the illustrated embodiment) including dielectric layers M1, M2, M3, M4, M5, M6, M7, M8, M9, M10, M11, M12, M13 and M14. The dielectric layers M1, M2, M3, M6, M7, M8, M9, M10, M11, M12 and M14 are made of a material showing a relatively low dielectric constant (e.g., dielectric constant ∈ 7), whereas the dielectric layers M4, M5 and M13 are made of a material showing a relatively high dielectric constant (e.g., dielectric constant ∈ 15). A pair of oppositely disposed lateral sides of each of the dielectric layers M1 through M14 is provided with three notches at each of the lateral sides. Grounding terminals T1 through T3, a low-frequency side terminal T4, a high-frequency side terminal T5 and an antenna terminal, or common terminal T6, are formed respectively in the notches of each of the dielectric layers. Note that the terminals may alternatively be formed by printing at the lateral sides without forming the notches.

A grounding electrode G1 is formed on the lowermost first dielectric layer M1 so as to include in the right half area thereof sites to be located respectively vis-à-vis the corresponding ones of the paired electrodes of capacitor C1 and capacitor C5 of a band pass filter of the lumped constant type having the first pass band that is formed on the right half of the second dielectric layer M2. On the other hand, the grounding electrode G1 formed on the lowermost first dielectric layer M1 includes in the left half area thereof sites to be located vis-à-vis the respective ones of the paired electrodes of capacitor C7 and capacitor C9 of a band pass filter of the distributed constant type having the second pass band that is formed on the left half of the second dielectric layer M2. The sites of those ones of the paired electrodes of the capacitors on the grounding electrode G1 also operate as capacitors. Additionally, the grounding electrode G1 is also connected to the grounding terminals T1, T2, T3 so as to operate as grounding electrode. It will be appreciated as a matter of course that the elements of the band pass filter of the lumped constant type and those of the band pass filter of the distributed constant type may be arranged inversely in terms of right and left.

The other electrode of the capacitor C1 and that of the capacitor C5 of the band pass filter of the lumped constant type having the first pass band are arranged in the right half area on the second dielectric layer M2 at respective positions located vis-à-vis the grounding electrode G1 formed on the first dielectric layer M1 with the dielectric layer interposed between them and the other electrode of the capacitor C7 and that of the capacitor C9 of the band pass filter of the distributed constant type having the second pass band are arranged in the left half area on the second dielectric layer M2 at respective positions located vis-à-vis the grounding electrode G1 formed on the first dielectric layer M1 with the dielectric layer interposed between them. A via conductor (which refers herein to a pillar-shaped conductive path formed in the through holes (via holes) bored through the respective dielectric layers in order to electrically connect the dielectric layers) V2-1 is formed on the second dielectric layer M2. The via conductor V2-1 is connected to site P1-1 in the grounding electrode G1 formed on the first dielectric layer M1.

One of the opposite electrodes of the capacitor C6 and one of the opposite electrodes of the capacitor C10 of the band pass filter of the distributed constant type having the second pass band are formed on the left half of the third dielectric layer M3. Those electrodes are connected respectively to the common terminal T6 and the high-frequency side terminal T5. Additionally, a via conductor V3-1 is formed on the third dielectric layer M3 at a position corresponding to the via conductor V2-1 formed in the second dielectric layer M2, while via conductors V3-2, V3-3, V3-4 and V3-5 are also formed on the third dielectric layer M3 at respective positions located vis-à-vis the sites P2-2, P2-3, P2-4 and P2-5 on the electrodes of the capacitor C1, the capacitor C5, the capacitor C9 and the capacitor C7 formed on the second dielectric layer M2. Note that the electrodes of the capacitor C6 and the capacitor C10 on the third dielectric layer M3 are electrically isolated from all the via conductors formed on the third dielectric layer M3.

The other electrode of the capacitor C6 and the electrode of the capacitor C10 of the band pass filter of the distributed constant type having the second pass band are formed on the left half of the fourth dielectric layer M4. Additionally, via conductors V4-1, V4-2, V4-3, V4-4 and V4-5 are formed on the fourth dielectric layer M4 at respective positions located vis-à-vis the via conductors V3-1, V3-2, V3-3, V3-4 and V3-5 formed on the third dielectric layer M3 and electrically connected to the respective via conductors V3-1, V3-2, V3-3, V3-4 and V3-5 formed on the third dielectric layer M3. As illustrated in FIG. 4, the electrodes of the capacitor C6 and the capacitor C10 are respectively electrically connected to the via conductors V4-5 and V4-4.

Electrode C8 that is a component of the electrode pattern that forms capacitor C8 in the equivalent circuit of the band pass filter of the distributed constant type having the second pass band is formed on the left half of the fifth dielectric layer M5, while via conductors V5-1, V5-2, V5-3, V5-4 and V5-5 are also formed on the fifth dielectric layer M5 at respective positions located vis-à-vis the via conductors V3-1, V3-2, V3-3, V3-4 and V3-5 formed on the third dielectric layer M3. While the capacitor C8 in the equivalent circuit is shown as a single capacitor C8 for the sake of convenience, it is formed by the electrodes C6, C8 and C10 in FIG. 4 (also in FIGS. 6 and 8). More specifically, the first capacitor is formed by the electrode C6 formed on the fourth dielectric layer M4 and the electrode C8 formed on the fifth dielectric layer M5 and the second capacitor is formed by the electrode C10 formed on the fourth dielectric layer M4 and the electrode C8 formed on the fifth dielectric layer M5 and the capacitor C8 is formed by connecting the capacitors in series to form the capacitor C8 in the equivalent circuit.

The capacitors L1 through L4 of the band pass filter of the lumped constant type having the first pass band are partly formed on the right half of each of the sixth through ninth dielectric layers M6 through M9. The inductors L1, L2 and L4 of the band pass filter of the lumped constant type having the first pass band are partly formed on the right half of each of the tenth and eleventh dielectric layers M10 and M11. Additionally, via conductors V6-1 through V6-5 are formed on the sixth dielectric layer M6 at respective positions located vis-à-vis the via conductors V3-1, V3-2, V3-3, V3-4 and V3-5 formed on the third dielectric layer M3.

One of the opposite ends of the part of the inductor L1 formed on the sixth dielectric layer M6 is connected to the via conductor V6-2 and hence to the site P2-2 of the electrode of the capacitor C1 formed on the second dielectric layer M2 by way of the corresponding via conductors V5-2, V4-2 and V3-2. Additionally, the mutually linked via conductors also operate as inductor. The other end of the part of the inductor L1 formed on the sixth dielectric layer M6 is connected to one of the opposite ends of the part of the inductor L1 formed on the seventh dielectric layer M7 by way of the via conductor V7-6 also formed on the seventh dielectric layer M7, while the other end of the part of the inductor L1 formed on the seventh dielectric layer M7 is connected to one of the opposite ends of the part of the inductor L1 formed on the eighth dielectric layer M8 by way of via conductor V8-6 also formed on the eighth dielectric layer M8. The other end of the part of the inductor L1 formed on the eighth dielectric layer M8 is connected to one of the opposite ends of the part of the inductor L1 formed on the ninth dielectric layer M9 by way of the via conductor V9-6 also formed on the ninth dielectric layer M9. The other end of the part of the inductor L1 formed on the ninth dielectric layer M9 is connected to one of the opposite ends of the inductor L1 formed on the tenth dielectric layer M10 by way of the via conductor V10-6 also formed on the tenth dielectric layer M10, while the other end of the part of the inductor L1 formed on the tenth dielectric layer M10 is connected to one of the opposite ends of the part of the inductor L1 formed on the eleventh dielectric layer M11 by way of the via conductor V11-6 also formed on the eleventh dielectric layer M11. The other end of the part of the inductor L1 formed on the eleventh dielectric layer M11 is connected to the low-frequency side terminal T4.

One of the opposite ends of the part of the inductor L2 formed on the sixth dielectric layer M6 is connected to the via conductor V6-1 and then to the site P1-1 of the grounding electrode G1 formed on the first dielectric layer M1 by way of the corresponding via conductors V5-1, V4-1, V3-1 and V2-1. Additionally, the mutually linked via conductors also operate as inductor. The other end of the part of the inductor L2 formed on the sixth dielectric layer M6 is connected to one of the opposite ends of the part of the inductor L2 formed on the seventh dielectric layer M7 by way of the via conductor V7-7 also formed on the seventh dielectric layer M7, while the other end of the part of the inductor L2 formed on the seventh dielectric layer M7 is connected to one of the opposite ends of the part of the inductor L2 formed on the eighth dielectric layer M8 by way of via conductor V8-7 also formed on the eighth dielectric layer M8. The other end of the part of the inductor L2 formed on the eighth dielectric layer M8 is connected to one of the opposite ends of the part of the inductor L2 formed on the ninth dielectric layer M9 by way of the via conductor V9-7 also formed on the ninth dielectric layer M9. The other end of the part of the inductor L2 formed on the ninth dielectric layer M9 is connected to one of the opposite ends of the inductor L2 formed on the tenth dielectric layer M10 by way of the via conductor V10-7 also formed on the tenth dielectric layer M10, while the other end of the part of the inductor L2 formed on the tenth dielectric layer M10 is connected to one of the opposite ends of the part of the inductor L2 formed on the eleventh dielectric layer M11 by way of the via conductor V11-7 also formed on the eleventh dielectric layer M11. The other end of the part of the inductor L2 formed on the eleventh dielectric layer M11 is connected to the corresponding electrode of the capacitor C3 formed on the twelfth dielectric layer M12 by way of the via conductor V12-7 also formed on the twelfth dielectric layer M12.

One of the opposite ends of each of the inductors L3 and L4 formed on the sixth dielectric layer M6 is connected to the via conductor V6-3 and the other end of the inductor L3 formed on the sixth dielectric layer M6 is connected to one of the opposite ends of the part of the inductor L3 formed on the seventh dielectric layer M7 by way of the via conductor V7-8 also formed on the seventh dielectric layer M7. The other end of the part of the inductor L3 formed on the seventh dielectric layer M7 is connected to one of the opposite ends of the part of the inductor L3 formed on the eighth dielectric layer M8 by way of via conductor V8-8 also formed on the eighth dielectric layer M8. The other end of the part of the inductor L3 formed on the eighth dielectric layer M8 is connected to one of the opposite ends of the part of the inductor L3 formed on the ninth dielectric layer M9 by way of the via conductor V9-8 also formed on the ninth dielectric layer M9. The other end of the part of the inductor L3 formed on the ninth dielectric layer M9 is connected to the capacitor C4 formed on the thirteenth dielectric layer M13 byway of the via conductor V10-8, the via conductor V11-8, the via conductor V12-8 and the via conductor V13-8 formed respectively on the tenth dielectric layer M10, the eleventh dielectric layer M11, the twelfth dielectric layer M12 and the thirteenth dielectric layer M13.

The other end of the inductor L4 formed on the sixth dielectric layer M6 is connected to one of the opposite ends of the part of the inductor L4 formed on the seventh dielectric layer M7 by way of the via conductor V7-9 also formed on the seventh dielectric layer M7. The other end of the part of the inductor L4 formed on the seventh dielectric layer M7 is connected to one of the opposite ends of the part of the inductor L4 formed on the eighth dielectric layer M8 by way of via conductor V8-9 also formed on the eighth dielectric layer M8. The other end of the part of the inductor L4 formed on the eighth dielectric layer M8 is connected to one of the opposite ends of the part of the inductor L4 formed on the ninth dielectric layer M9 by way of the via conductor V9-9 also formed on the ninth dielectric layer M9. The other end of the part of the inductor L4 formed on the ninth dielectric layer M9 is connected to one of the opposite ends of the part of the inductor L4 formed on the tenth dielectric layer M10 by way of the via conductor M10-9 also formed on the tenth dielectric layer M10. The other end of the part of the inductor L4 formed on the tenth dielectric layer M10 is connected to one of the opposite ends of the part of the inductor L4 formed on the eleventh dielectric layer M11 by way of the via conductor V11-9 also formed on the eleventh dielectric layer M11. The other end of the part of the inductor L4 formed on the eleventh dielectric layer M11 is connected to the common terminal T6.

The capacitors C2, C3 and C4 of the band pass filter of the lumped constant type having the first pass band are formed on the right half of the twelfth dielectric layer M12 and also on the right half of the thirteenth dielectric layer M13. One of the electrodes of the capacitor C2 and the corresponding one of the electrodes of the capacitor C3, the capacitors C2 and C3 being formed on the twelfth dielectric layer M12, are connected to each other so as to operate as a single electrode. The electrode of the capacitor C4 formed on the twelfth dielectric layer M12 is connected to the connection point of the inductors L3 and L4 formed on the sixth dielectric layer M6 byway of the via conductors V12-3, V11-3, V10-3, V9-3, V8-3 and V7-3 and also to the site P2-3 of the electrode of the capacitor C5 formed on the second dielectric layer M2 by way of the via conductors V6-3, V5-3, V4-3 and V3-3. Additionally, the mutually linked via conductors also operate as inductor. The other electrode of the capacitor C2 formed on the thirteenth dielectric layer M13 is connected to the low-frequency side terminal T4 and the other electrodes of the capacitors C3 and C4 formed on the thirteenth dielectric layer M13 are connected to each other.

As shown in FIG. 4, a grounding electrode G13 is formed on the left half of the thirteenth dielectric layer M13 in a region that contains the via conductors V13-4 and V13-5 and connected to the grounding terminals T1 and T3.

A conductive material is arranged in the through holes (via holes) formed in the dielectric layers to form via conductors that operate as conductive paths electrically connecting the dielectric layers. The via conductors V3-5 through V13-5 form resonance elements R11 and R12 of the band pass filter of the distributed constant type having the second pass band, while the via conductors V3-4 through V13-4 form resonance elements R21 and R22 of the band pass filter of the distributed constant type having the second pass band.

FIG. 5 is an equivalent circuit of the diplexer having the above described configuration. In FIG. 5, M denotes the inductive coupling of the resonance elements R11 and R21 and that of the resonance elements R12 and R22, the magnitude of which can be defined by the gap separating the resonance elements. The circuit including the inductor L2 in the band pass filter of the lumped constant type can be formed as series resonator. Additionally, the circuit including the capacitor C6 in the band pass filter of the distributed constant type can be formed as parallel resonator. Furthermore, the circuit including the capacitor C10 can also be formed as parallel resonator.

Figure 6:
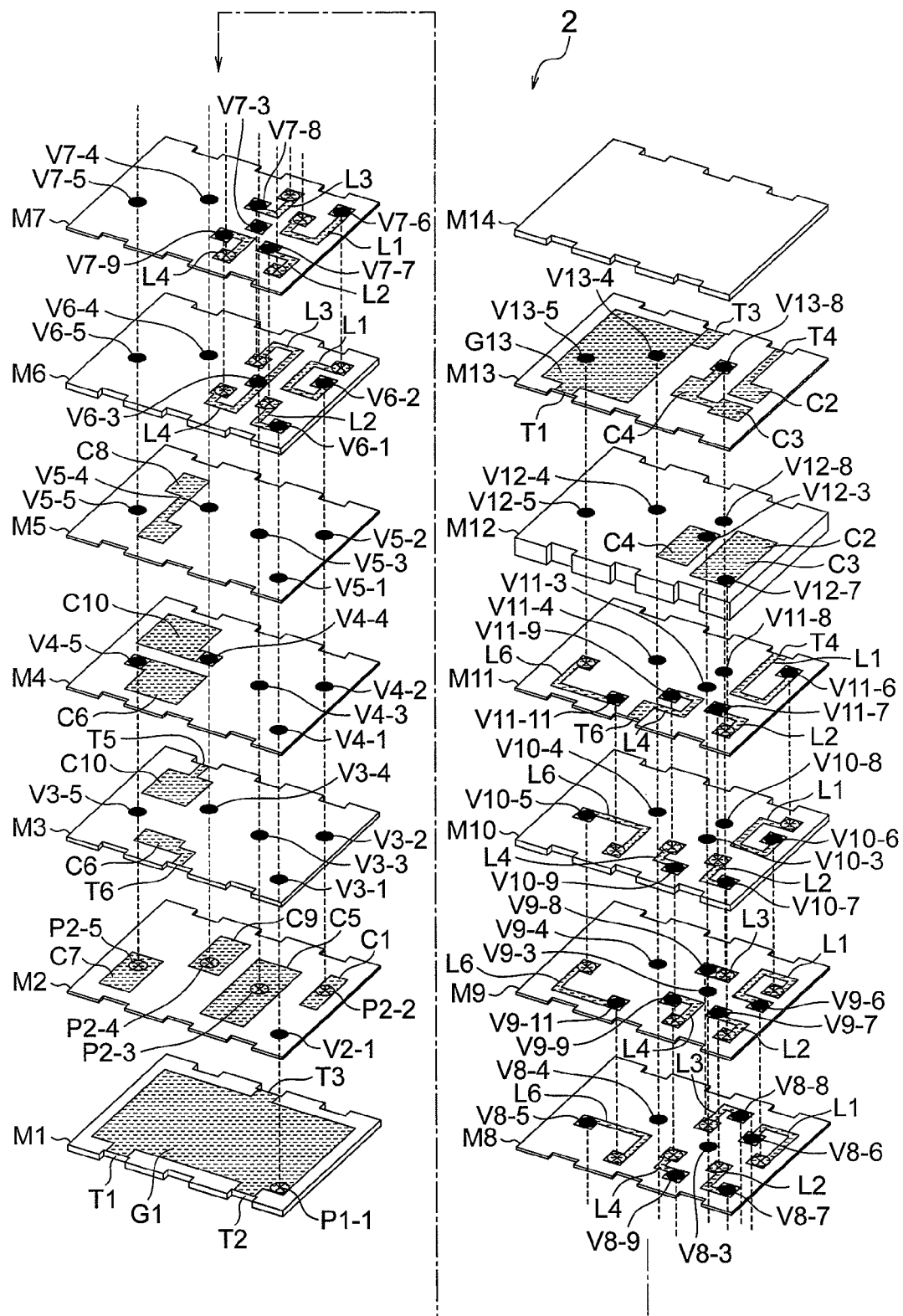
FIG. 6 is an exploded schematic perspective view of the embodiment of FIG. 2.
Figure 7:
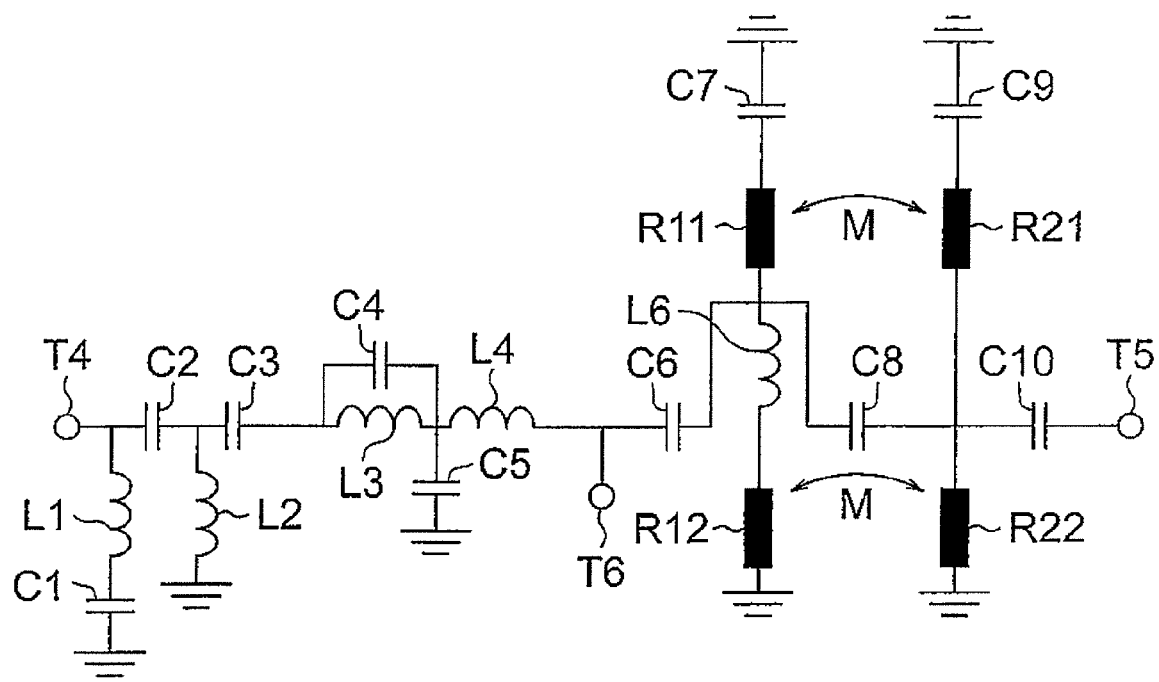
FIG. 7 is a schematic circuit diagram of the equivalent circuit of the diplexer of FIG. 6.

FIGS. 6 and 7 illustrate another embodiment of diplexer according to the present invention. In FIGS. 6 and 7, the components similar to those of FIGS. 4 and 5 are denoted respectively by the same reference symbols.

FIG. 6 is an exploded schematic perspective view of the embodiment. Referring to FIG. 6, the illustrated diplexer 2 is formed by a multilayer substrate that is prepared by laying a plurality of dielectric layers (fourteen in the case of the illustrated embodiment) including dielectric layers M1, M2, M3, M4, M5, M6, M7, M8, M9, M10, M11, M12, M13 and M14. The dielectric layers M1, M2, M3, M6, M7, M8, M9, M10, M11, M12 and M14 are made of a material showing a relatively low dielectric constant (e.g., dielectric constant $\in$ 7), whereas the dielectric layers M4, M5 and M13 are made of a material showing a relatively high dielectric constant (e.g., dielectric constant $\in$ 15). A pair of oppositely disposed lateral sides of each of the dielectric layers M1 through M14 is provided with three notches at each of the lateral sides. Grounding terminals T1 through T3, a low-frequency side terminal T4, a high-frequency side terminal T5 and an antenna terminal, or common terminal T6, are formed respectively in the notches of each of the dielectric layers. Note that the terminals may alternatively be formed by printing at the lateral sides without forming the notches.

A grounding electrode G1 is formed on the lowermost first dielectric layer M1 so as to include in the right half area thereof sites to be located respectively vis-à-vis the corresponding ones of the paired electrodes of capacitor C1 and capacitor C5 of a band pass filter of the lumped constant type having the first pass band that is formed on the right half of the second dielectric member M2. On the other hand, the grounding electrode G1 formed on the lowermost first dielectric layer M1 includes in the left half area thereof sites to be located vis-à-vis the respective ones of the paired electrodes of capacitor C7 and capacitor C9 of a band pass filter of the distributed constant type having the second pass band that is formed on the left half of the second dielectric member M2. The sites of those ones of the paired electrodes of the capacitors on the grounding electrode G1 also operate as capacitors. Additionally, the grounding electrode G1 is also connected to the grounding terminals T1, T2 and T3 so as to operate as grounding electrode. It will be appreciated as a matter of course that the elements of the band pass filter of the lumped constant type and those of the band pass filter of the distributed constant type may be arranged inversely in terms of right and left.

The other electrode of the capacitor C1 and that of the capacitor C5 of the band pass filter of the lumped constant type having the first pass band are arranged in the right half area on the second dielectric layer M2 at respective positions located vis-à-vis the grounding electrode G1 formed on the first dielectric layer M1 with the right half of the dielectric layer M2 interposed between them and the other electrode of the capacitor C7 and that of the capacitor C9 of the band pass filter of the distributed constant type having the second pass band are arranged in the left half area on the second dielectric layer M2 at respective positions located vis-à-vis the grounding electrode G1 formed on the first dielectric layer M1 with the left half of the dielectric layer M2 interposed between them. A via conductor V2-1 is formed in the second dielectric layer M2. The via conductor V2-1 is connected to site P1-1 in the grounding electrode G1 formed on the first dielectric layer M1.

One of the opposite electrodes of the capacitor C6 and one of the opposite electrodes of the capacitor C10 of the band pass filter of the distributed constant type having the second pass band are formed on the left half of the third dielectric layer M3. Those electrodes are connected respectively to the common terminal T6 and the high-frequency side terminal T5. Additionally, a via conductor V3-1 is formed in the third dielectric layer M3 at a position corresponding to the via conductor V2-1 formed in the second dielectric layer M2, while via conductors V3-2, V3-3, V3-4 and V3-5 are also formed in the third dielectric layer M3 at respective positions located vis-à-vis the sites P2-2, P2-3, P2-4 and P2-5 on the electrodes of the capacitor C1, the capacitor C5, the capacitor C9 and the capacitor C7 formed on the second dielectric layer M2. Note that the electrodes of the capacitor C6 and the capacitor C10 on the third dielectric layer M3 are electrically isolated from all the via conductors formed on the third dielectric layer M3.

The other electrode of the capacitor C6 and the electrode of the capacitor C10 of the band pass filter of the distributed constant type having the second pass band are formed on the left half of the fourth dielectric layer M4. Additionally, via conductors V4-1, V4-2, V4-3, V4-4 and V4-5 are formed on the fourth dielectric layer M4 at respective positions located vis-à-vis the via conductors V3-1, V3-2, V3-3, V3-4 and V3-5 formed on the third dielectric layer M3 and electrically connected to the respective via conductors V3-1, V3-2, V3-3, V3-4 and V3-5 formed on the third dielectric layer M3. As illustrated, the electrodes of the capacitor C6 and the capacitor C10 are respectively electrically connected to the via conductors V4-5 and V4-4.

Electrode C8 that is a component of the electrode pattern that forms capacitor C8 in the equivalent circuit of the band pass filter of the distributed constant type having the second pass band is formed on the left half of the fifth dielectric layer MS, while via conductors VS-1, V5-2, V5-3, V5-4 and V5-5 are also formed in the fifth dielectric layer M5 at respective positions located vis-à-vis the via conductors V3-1, V3-2, V3-3, V3-4 and V3-5 formed on the third dielectric layer M3. While the capacitor C8 in the equivalent circuit is shown as a single capacitor C8 for the sake of convenience, it is formed by the electrodes C6, C8 and C10 in FIG. 6 (also in FIGS. 4 and 8). More specifically, the first capacitor is formed by the electrode C6 formed on the fourth dielectric layer M4 and the electrode C8 formed on the fifth dielectric layer M5 and the second capacitor is formed by the electrode C10 formed on the fourth dielectric layer M4 and the electrode C8 formed on the fifth dielectric layer M5 and the capacitor C8 is formed by connecting the capacitors in series to form the capacitor C8 in the equivalent circuit.

The inductors L1 through L4 of the band pass filter of the lumped constant type having the first pass band are partly formed on the right half of each of the sixth through ninth dielectric layers M6 through M9. The inductors L1, L2 and L4 of the band pass filter of the lumped constant type having the first pass band are partly formed on the right half of each of the tenth and eleventh dielectric layers M10 and M11. Additionally, via conductors V6-1 through V6-5 are formed on the sixth dielectric layer M6 at respective positions located vis-à-vis the via conductors V3-1, V3-2, V3-3, V3-4 and V3-5 formed on the third dielectric layer M3.

One of the opposite ends of the part of the inductor L1 formed on the sixth dielectric layer M6 is connected to the via conductor V6-2 and hence to the site P2-2 of the electrode of the capacitor C1 formed on the second dielectric layer M2 by way of the corresponding via conductors V5-2, V4-2 and V3-2. Additionally, the mutually linked via conductors also operate as inductor. The other end of the part of the inductor L1 formed on the sixth dielectric layer M6 is connected to one of the opposite ends of the part of the inductor L1 formed on the seventh dielectric layer M7 by way of the via conductor V7-6 also formed on the seventh dielectric layer M7, while the other end of the part of the inductor L1 formed on the seventh dielectric layer M7 is connected to one of the opposite ends of the part of the inductor L1 formed on the eighth dielectric layer M8 by way of via conductor V8-6 also formed on the eighth dielectric layer M8. The other end of the part of the inductor L1 formed on the eighth dielectric layer M8 is connected to one of the opposite ends of the part of the inductor L1 formed on the ninth dielectric layer M9 by way of the via conductor V9-6 also formed on the ninth dielectric layer M9. The other end of the part of the inductor L1 formed on the ninth dielectric layer M9 is connected to one of the opposite ends of the inductor L1 formed on the tenth dielectric layer M10 by way of the via conductor V10-6 also formed on the tenth dielectric layer M10, while the other end of the part of the inductor L1 formed on the tenth dielectric layer M10 is connected to one of the opposite ends of the part of the inductor L1 formed on the eleventh dielectric layer M11 by way of the via conductor V11-6 also formed on the eleventh dielectric layer M11. The other end of the part of the inductor L1 formed on the eleventh dielectric layer M11 is connected to the low-frequency side terminal T4.

One of the opposite ends of the part of the inductor L2 formed on the sixth dielectric layer M6 is connected to the site P1-1 of the corresponding electrode of the capacitor C5 formed on the first dielectric layer M1 by way of the corresponding via conductors VS-1, V4-1, V3-1 and V2-1. Additionally, the mutually linked via conductors also operate as inductor. The other end of the part of the inductor L2 formed on the sixth dielectric layer M6 is connected to one of the opposite ends of the part of the inductor L2 formed on the seventh dielectric layer M7 by way of the via conductor V7-7 also formed on the seventh dielectric layer M7, while the other end of the part of the inductor L2 formed on the seventh dielectric layer M7 is connected to one of the opposite ends of the part of the inductor L2 formed on the eighth dielectric layer M8 by way of via conductor V8-7 also formed on the eighth dielectric layer M8. The other end of the part of the inductor L2 formed on the eighth dielectric layer M8 is connected to one of the opposite ends of the part of the inductor L2 formed on the ninth dielectric layer M9 by way of the via conductor V9-7 also formed on the ninth dielectric layer M9. The other end of the part of the inductor L2 formed on the ninth dielectric layer M9 is connected to one of the opposite ends of the part of the inductor L2 formed on the tenth dielectric layer M10 by way of the via conductor V10-7 also formed on the tenth dielectric layer M10, while the other end of the part of the inductor L2 formed on the tenth dielectric layer M10 is connected to one of the opposite ends of the part of the inductor L2 formed on the eleventh dielectric layer M11 by way of the via conductor V11-7 also formed on the eleventh dielectric layer M11. The other end of the part of the inductor L2 formed on the eleventh dielectric layer M11 is connected to the corresponding electrode of the capacitor C3 formed on the twelfth dielectric layer M12 by way of the via conductor V12-7 also formed on the twelfth dielectric layer M12.

One of the opposite ends of each of the inductors L3 and L4 formed on the sixth dielectric layer M6 is connected to the via conductor V6-3 and the other end of the inductor L3 formed on the sixth dielectric layer M6 is connected to one of the opposite ends of the part of the inductor L3 formed on the seventh dielectric layer M7 by way of the via conductor V7-8 also formed on the seventh dielectric layer M7. The other end of the part of the inductor L3 formed on the seventh dielectric layer M7 is connected to one of the opposite ends of the part of the inductor L3 formed on the eighth dielectric layer M8 by way of via conductor V8-8 also formed on the eighth dielectric layer M8. The other end of the part of the inductor L3 formed on the eighth dielectric layer M8 is connected to one of the opposite ends of the part of the inductor L3 formed on the ninth dielectric layer M9 by way of the via conductor V9-8 also formed on the ninth dielectric layer M9. The other end of the part of the inductor L3 formed on the ninth dielectric layer M9 is connected to the corresponding electrode of the capacitor C4 formed on the thirteenth dielectric layer 13 by way of the via conductor V10-8, the via conductor V11-8, the via conductor V12-8 and the via conductor V13-8 formed respectively on the tenth dielectric layer M10, the eleventh dielectric layer M11, the twelfth dielectric layer M12 and the thirteenth dielectric layer M13.

The other end of the part of the inductor L4 formed on the sixth dielectric layer M6 is connected to one of the opposite ends of the part of the inductor L4 formed on the seventh dielectric layer M7 by way of the via conductor V7-9 also formed on the seventh dielectric layer M7. The other end of the part of the inductor L4 formed on the seventh dielectric layer M7 is connected to one of the opposite ends of the part of the inductor L4 formed on the eighth dielectric layer M8 by way of via conductor V8-9 also formed on the eighth dielectric layer M8. The other end of the part of the inductor L4 formed on the eighth dielectric layer M8 is connected to one of the opposite ends of the part of the inductor L4 formed on the ninth dielectric layer M9 by way of the via conductor V9-9 also formed on the ninth dielectric layer M9. The other end of the part of the inductor L4 formed on the ninth dielectric layer M9 is connected to one of the opposite ends of the part of the inductor L4 formed on the tenth dielectric layer M10 by way of the via conductor M10-9 also formed on the tenth dielectric layer M10. The other end of the part of the inductor L4 formed on the tenth dielectric layer M10 is connected to one of the opposite ends of the part of the inductor L4 formed on the eleventh dielectric layer M11 by way of the via conductor V11-9 also formed on the eleventh dielectric layer M11. The other end of the part of the inductor L4 formed on the eleventh dielectric layer M11 is connected to the common terminal T6.

The capacitors C2, C3 and C4 of the band pass filter of the lumped constant type having the first pass band are formed on the right half of the twelfth dielectric layer M12 and also on the right half of the thirteenth dielectric layer M13. One of the electrodes of the capacitor C2 and the corresponding one of the electrodes of the capacitor C3, the capacitors C2 and C3 being formed on the twelfth dielectric layer M12, are commonly connected. The electrode of the capacitor C4 formed on the twelfth dielectric layer M12 is connected to the connection point of the inductors L3 and L4 formed on the sixth dielectric layer M6 by way of the via conductors V12-3, V11-3, V10-3, V9-3, V8-3 and V7-3 and also to the site P2-3 of the electrode of the capacitor C5 formed on the second dielectric layer M2. Additionally, the mutually linked via conductors also operate as inductor. The other electrode of the capacitor C2 formed on the thirteenth dielectric layer M13 is connected to the low-frequency side terminal T4 and the other electrodes of the capacitors C3 and C4 formed on the thirteenth dielectric layer M13 are connected to each other.

In this embodiment, inductor L6 is formed on the left halves of the eighth dielectric layer M8 through the eleventh dielectric layer M11 and connected to the two resonance elements R11 and R12 that are by turn connected in series to the capacitor C7 of the band pass filter of the distributed constant type having the second pass band. More specifically, an L-shaped element that takes part of the inductor L6 is formed on each of the eighth dielectric layer M8 through the eleventh dielectric layer M11 and one of the opposite ends of the part of the inductor L6 formed on the eighth dielectric layer M8 is connected to the via conductor V8-5, while the other end thereof is connected to one of the opposite ends of the part of the inductor L6 formed on the ninth dielectric layer M9 by way of the via conductor V9-11 formed also on the ninth dielectric layer M9. The other end of the part of the inductor L6 formed on the ninth dielectric layer M9 is connected to one of the opposite ends of the part of the inductor L6 formed on the tenth dielectric layer M10 by way of the via conductor V10-5 formed also on the tenth dielectric layer M10. The other end of the part of the inductor L6 formed on the tenth dielectric layer M10 is connected to one of the opposite ends of the part of the inductor L6 formed on the eleventh dielectric layer M11 by way of the via conductor V11-11 formed also on the eleventh dielectric layer M11. The other end of the part of the inductor L6 formed on the eleventh dielectric layer M11 is connected to the via conductor V12-5 formed on the twelfth dielectric layer M12. An inductor L6 showing a spiral profile is formed in this way. The inductor L6 may alternatively be made to have a bent section showing a U-shaped profile, a meandering profile or an arc-shaped profile instead of a spiral profile.

As shown in FIG. 6, electrode G13 is formed on the left half of the thirteenth dielectric layer M13 in a region containing the via conductors V13-4 and V13-5. The electrode G13 is connected to the grounding terminal T3.

A conductive material is arranged in the through holes (via holes) formed in the dielectric layers to form via conductors that operate as conductive paths electrically connecting the dielectric layers. The via conductors V3-5 through V8-5 form resonance element R12 of the band pass filter of the distributed constant type having the second pass band, while the via conductors V11-5 through 13-5 form resonance element R11 of the band pass filter of the distributed constant type having the second pass band, the inductor L6 showing a spiral profile being connected between the resonance elements R11 and R12. On the other hand, the via conductors V3-5 through V8-5 form resonance element R22 of the band pass filter of the distributed constant type having the second pass band, while the via conductors V3-4 through V13-4 form resonance element R21 of the band pass filter of the distributed constant type having the second pass band.

FIG. 7 is an equivalent circuit of the diplexer having the above-described configuration. In FIG. 7, M denotes the inductive coupling of the resonance elements R11 and R21 and that of the resonance elements R12 and R22, the magnitude of which can be defined by means of the gap separating the resonance elements. The magnitude can also be defined by means of the profile and the winding direction of the inductor L6. The circuit including the inductor L2 in the band pass filter of the lumped constant type can be formed as series resonator. Additionally, the circuit including the capacitor C6 in the band pass filter of the distributed constant type can be formed as parallel resonator. Furthermore, the circuit including the capacitor C10 can also be formed as parallel resonator.

As shown in FIG. 6, electrode G13 is formed on the left half of the thirteenth dielectric layer M13 in a region containing the via conductors V13-4 and V13-5. The grounding electrode G13 is connected to the grounding terminal T1 and T3.

Figure 8:
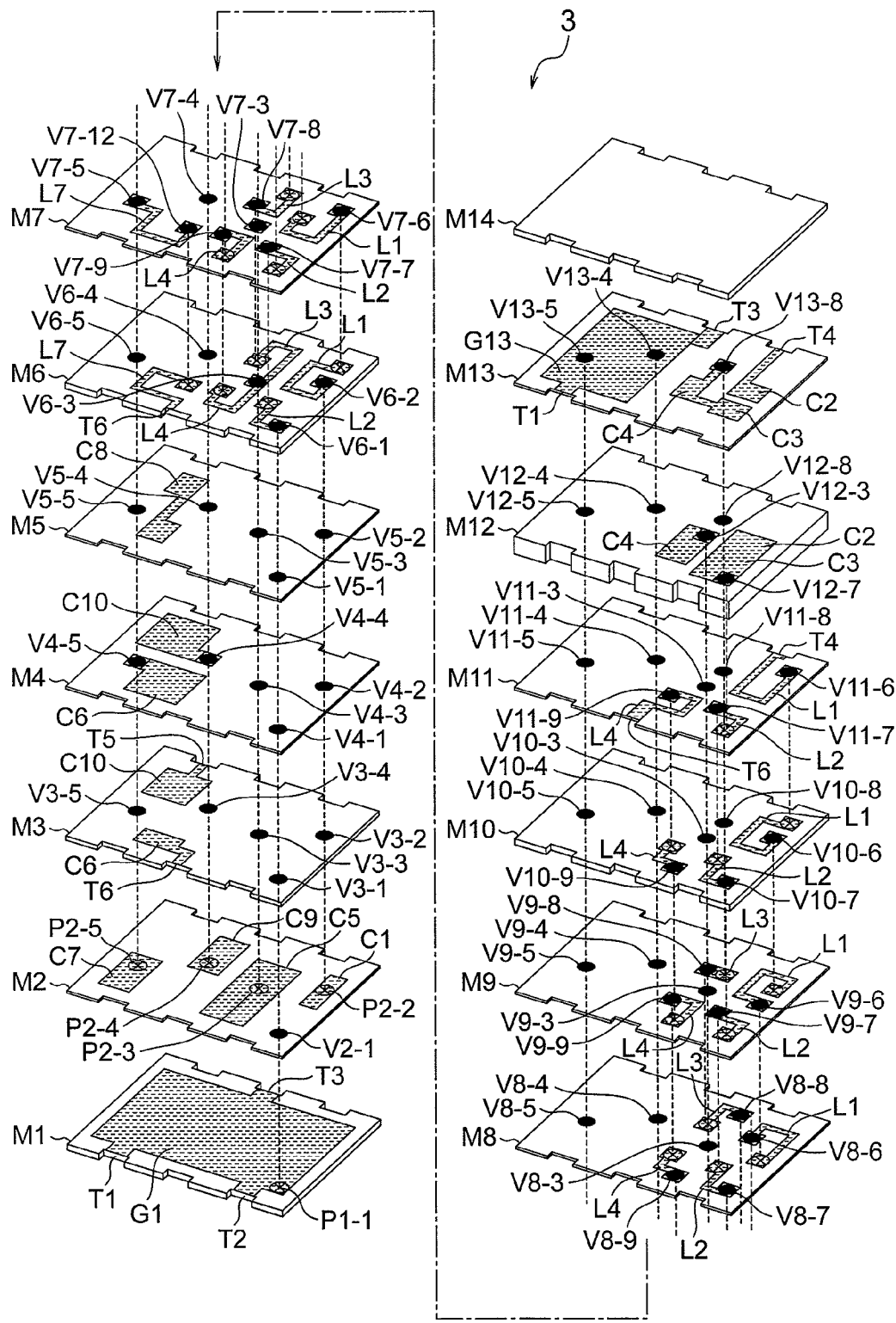
FIG. 8 is an exploded schematic perspective view of diplexer according to still another embodiment of the present invention.
Figure 9:
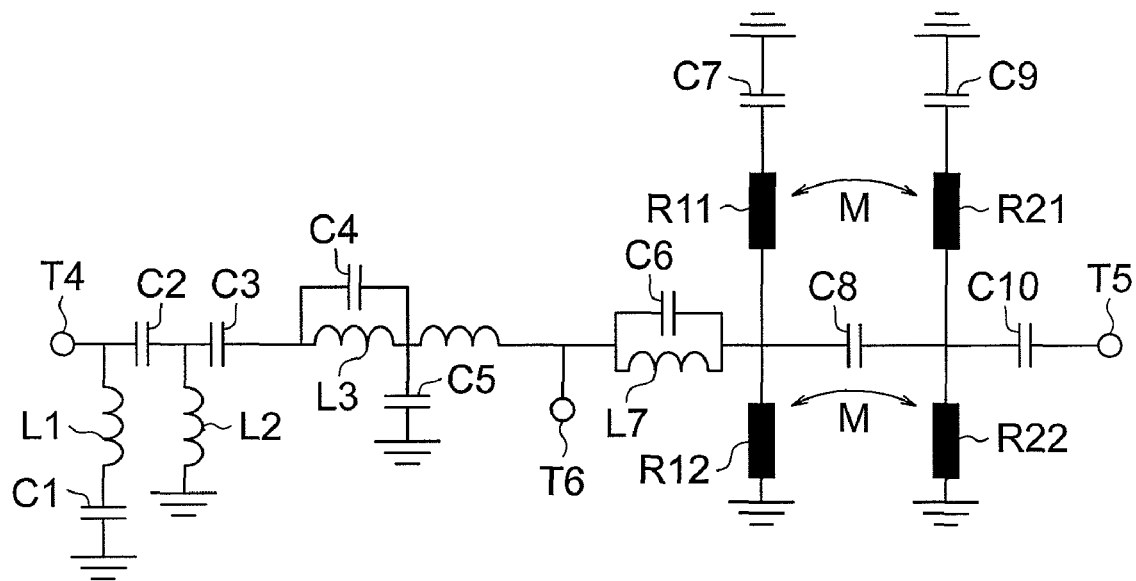
FIG. 9 is a schematic circuit diagram of the equivalent circuit of the diplexer of FIG. 8.

FIGS. 8 and 9 illustrate still another embodiment of diplexer according to the present invention. In FIGS. 8 and 9, the components similar to those of FIGS. 4 and 5 are denoted respectively by the same reference symbols.

FIG. 8 is an exploded schematic perspective view of the embodiment. Referring to FIG. 8, the illustrated diplexer 3 is formed by a multilayer substrate that is prepared by laying a plurality of dielectric layers (fourteen in the case of the illustrated embodiment) including dielectric layers M1, M2, M3, M4, MS, M6, M7, M8, M9, M10, M11, M12, M13 and M14. The dielectric layers M1, M2, M3, M6, M7, M8, M9, M10, M11, M12 and M14 are made of a material showing a relatively low dielectric constant (e.g., dielectric constant ∈ 7), whereas the dielectric layers M4, M5 and M13 are made of a material showing a relatively high dielectric constant (e.g., dielectric constant ∈ 15). A pair of oppositely disposed lateral sides of each of the dielectric layers M1 through M14 is provided with three notches at each of the lateral sides. Grounding terminals T1 through T3, a low-frequency side terminal T4, a high-frequency side terminal T5 and an antenna terminal, or common terminal T6, are formed respectively in the notches of each of the dielectric layers. Note that, in this embodiment again, the terminals may alternatively be formed by printing at the lateral sides without forming the notches.

A grounding electrode G1 is formed on the lowermost first dielectric layer M1 so as to include in the right half area thereof sites to be located respectively vis-à-vis the corresponding ones of the paired electrodes of capacitor C1 and capacitor C9 of a band pass filter of the lumped constant type having the first pass band that is formed on the right half of the second dielectric member M2. On the other hand, the grounding electrode G1 formed on the lowermost first dielectric layer M1 includes in the left half area thereof sites to be located vis-à-vis the respective ones of the paired electrodes of capacitor C7 and capacitor C9 of a band pass filter of the distributed constant type having the second pass band that is formed on the left half of the second dielectric member M2. The sites of those ones of the paired electrodes of the capacitors on the grounding electrode G1 also operate as capacitors. Additionally, the grounding electrode G1 is also connected to the grounding terminals T1, T2 and T3 so as to operate as grounding electrode. It will be appreciated as a matter of course that the elements of the band pass filter of the lumped constant type and those of the band pass filter of the distributed constant type may be arranged inversely in terms of right and left.

The other electrode of the capacitor C1 and that of the capacitor C5 of the band pass filter of the lumped constant type having the first pass band are arranged in the right half area on the second dielectric layer M2 at respective positions located vis-à-vis the grounding electrode G1 formed on the first dielectric layer M1 with the right half of the dielectric layer M2 interposed between them and the other electrode of the capacitor C7 and that of the capacitor C9 of the band pass filter of the distributed constant type having the second pass band are arranged in the left half area on the second dielectric layer M2 at respective positions located vis-à-vis the grounding electrode G1 formed on the first dielectric layer M1 with the left half of the dielectric layer M2 interposed between them. A via conductor V2-1 is formed in the second dielectric layer M2. The via conductor V2-1 is connected to site P1-1 in the grounding electrode G1 formed on the first dielectric layer M1.

One of the opposite electrodes of the capacitor C6 and one of the opposite electrodes of the capacitor C10 of the band pass filter of the distributed constant type having the second pass band are formed on the left half of the third dielectric layer M3. Those electrodes are connected respectively to the common terminal T6 and the high-frequency side terminal T5. Additionally, a via conductor V3-1 is formed in the third dielectric layer M3 at a position corresponding to the via conductor V2-1 formed in the second dielectric layer M2, while via conductors V3-2, V3-3, V3-4 and V3-5 are also formed in the third dielectric layer M3 at respective positions located vis-à-vis the sites P2-2, P2-3, P2-4 and P2-5 on the electrodes of the capacitor C1, the capacitor C5, the capacitor C9 and the capacitor C7 formed on the second dielectric layer M2. Note that the electrodes of the capacitor C6 and the capacitor C10 on the third dielectric layer M3 are electrically isolated from all the via conductors formed on the third dielectric layer M3.

The other electrode of the capacitor C6 and the electrode of the capacitor C10 of the band pass filter of the distributed constant type having the second pass band are formed on the left half of the fourth dielectric layer M4. Additionally, via conductors V4-1, V4-2, V4-3, V4-4 and V4-5 are formed on the fourth dielectric layer M4 at respective positions located vis-à-vis the via conductors V3-1, V3-2, V3-3, V3-4 and V3-5 formed on the third dielectric layer M3 and electrically connected to the respective via conductors V3-1, V3-2, V3-3, V3-4 and V3-5 formed on the third dielectric layer M3. As illustrated in FIG. 8, the electrodes of the capacitor C6 and the capacitor C10 are respectively electrically connected to the via conductors V4-5 and V4-4.

Electrode C8 that is a component of the electrode pattern that forms capacitor C8 in the equivalent circuit of the band pass filter of the distributed constant type having the second pass band is formed on the left half of the fifth dielectric layer MS, while via conductors V5-1, V5-2, VS-3, VS-4 and V5-5 are also formed in the fifth dielectric layer MS at respective positions located vis-à-vis the via conductors V3-1, V3-2, V3-3, V3-4 and V3-5 formed on the third dielectric layer M3. While the capacitor C8 in the equivalent circuit is shown as a single capacitor C8 for the sake of convenience, it is formed by the electrodes C6, C8 and C10 in FIG. 8 (also in FIGS. 4 and 6). More specifically, the first capacitor is formed by the electrode C6 formed on the fourth dielectric layer M4 and the electrode C8 formed on the fifth dielectric layer MS and the second capacitor is formed by the electrode C10 formed on the fourth dielectric layer M4 and the electrode C8 formed on the fifth dielectric layer MS and the capacitor C8 is formed by connecting the capacitors in series to form the capacitor C8 in the equivalent circuit.

The inductors L1 through L4 of the band pass filter of the lumped constant type having the first pass band are partly formed on the right half of each of the sixth through ninth dielectric layers M6 through M9. The inductors L1, L2 and L4 of the band pass filter of the lumped constant type having the first pass band are partly formed on the right half of each of the tenth and eleventh dielectric layers M10 and M11. Additionally, via conductors V6-1 through V6-5 are formed on the sixth dielectric layer M6 at respective positions located vis-à-vis the via conductors V3-1, V3-2, V3-3, V3-4 and V3-5 formed on the third dielectric layer M3.

One of the opposite ends of the part of the inductor L1 formed on the sixth dielectric layer M6 is connected to the via conductor V6-2 and hence to the site P2-2 of the electrode of the capacitor C1 formed on the second dielectric layer M2 by way of the corresponding via conductors V5-2, V4-2 and V3-2. Additionally, the mutually linked via conductors also operate as inductor. The other end of the part of the inductor L1 formed on the sixth dielectric layer M6 is connected to one of the opposite ends of the part of the inductor L1 formed on the seventh dielectric layer M7 by way of the via conductor V7-6 also formed on the seventh dielectric layer M7, while the other end of the part of the inductor L1 formed on the seventh dielectric layer M7 is connected to one of the opposite ends of the part of the inductor L1 formed on the eighth dielectric layer M8 by way of via conductor V8-6 also formed on the eighth dielectric layer M8. The other end of the part of the inductor L1 formed on the eighth dielectric layer M8 is connected to one of the opposite ends of the part of the inductor L1 formed on the ninth dielectric layer M9 by way of the via conductor V9-6 also formed on the ninth dielectric layer M9. The other end of the part of the inductor L1 formed on the ninth dielectric layer M9 is connected to one of the opposite ends of the inductor L1 formed on the tenth dielectric layer M10 by way of the via conductor V10-6 also formed on the tenth dielectric layer M10, while the other end of the part of the inductor L1 formed on the tenth dielectric layer M10 is connected to one of the opposite ends of the part of the inductor L1 formed on the eleventh dielectric layer M11 by way of the via conductor V11-6 also formed on the eleventh dielectric layer M11. The other end of the part of the inductor L1 formed on the eleventh dielectric layer M11 is connected to the low-frequency side terminal T4 of the eleventh dielectric layer M11.

One of the opposite ends of the part of the inductor L2 formed on the sixth dielectric layer M6 is connected to the via conductor V6-1 and hence to the site P1-1 of the grounding electrode G1 formed on the first dielectric layer M1 by way of the corresponding via conductors V5-1, V4-1, V3-1 and V2-1. Additionally, the mutually linked via conductors also operate as inductor. The other end of the part of the inductor L2 formed on the sixth dielectric layer M6 is connected to one of the opposite ends of the part of the inductor L2 formed on the seventh dielectric layer M7 by way of the via conductor V7-7 also formed on the seventh dielectric layer M7, while the other end of the part of the inductor L2 formed on the seventh dielectric layer M7 is connected to one of the opposite ends of the part of the inductor L2 formed on the eighth dielectric layer M8 by way of the via conductor V8-7 also formed on the eighth dielectric layer M8. The other end of the part of the inductor L2 formed on the eighth dielectric layer M8 is connected to one of the opposite ends of the part of the inductor L2 formed on the ninth dielectric layer M9 by way of the via conductor V9-7 also formed on the ninth dielectric layer M9. The other end of the part of the inductor L2 formed on the ninth dielectric layer M9 is connected to one of the opposite ends of the inductor L2 formed on the tenth dielectric layer M10 by way of the via conductor V10-7 also formed on the tenth dielectric layer M10, while the other end of the part of the inductor L2 formed on the tenth dielectric layer M10 is connected to one of the opposite ends of the part of the inductor L2 formed on the eleventh dielectric layer M11 by way of the via conductor V11-7 also formed on the eleventh dielectric layer M11. The other end of the part of the inductor L2 formed on the eleventh dielectric layer M11 is connected to the corresponding electrode of the capacitor C3 formed on the twelfth dielectric layer M12 by way of the via conductor V12-7 also formed on the twelfth dielectric layer M12.

One of the opposite ends of each of the inductors L3 and L4 formed on the sixth dielectric layer M6 is connected to the via conductor V6-3 and the other end of the inductor L3 formed on the sixth dielectric layer M6 is connected to one of the opposite ends of the part of the inductor L3 formed on the seventh dielectric layer M7 by way of the via conductor V7-8 also formed on the seventh dielectric layer M7. The other end of the part of the inductor L3 formed on the seventh dielectric layer M7 is connected to one of the opposite ends of the part of the inductor L3 formed on the eighth dielectric layer M8 by way of via conductor V8-8 also formed on the eighth dielectric layer M8. The other end of the part of the inductor L3 formed on the eighth dielectric layer M8 is connected to one of the opposite ends of the part of the inductor L3 formed on the ninth dielectric layer M9 by way of the via conductor V9-8 also formed on the ninth dielectric layer M9. The other end of the part of the inductor L3 formed on the ninth dielectric layer M9 is connected to the electrode of the capacitor C4 formed on the thirteenth dielectric layer M13 by way of the via conductors V10-8, the via conductor V11-8, the via conductor V12-8 and the via conductor V13-8 formed respectively on the tenth dielectric layer M10, the eleventh dielectric layer M11, the twelfth dielectric layer M12 and the thirteenth dielectric layer M13.

The other end of the inductor L4 formed on the sixth dielectric layer M6 is connected to one of the opposite ends of the part of the inductor L4 formed on the seventh dielectric layer M7 by way of the via conductor V7-9 also formed on the seventh dielectric layer M7. The other end of the part of the inductor L4 formed on the seventh dielectric layer M7 is connected to one of the opposite ends of the part of the inductor L4 formed on the eighth dielectric layer M8 by way of the via conductor V8-9 also formed on the eighth dielectric layer M8. The other end of the part of the inductor L4 formed on the eighth dielectric layer M8 is connected to one of the opposite ends of the part of the inductor L4 formed on the ninth dielectric layer M9 by way of the via conductor V9-9 also formed on the ninth dielectric layer M9. The other end of the part of the inductor L4 formed on the ninth dielectric layer M9 is connected to one of the opposite ends of the part of the inductor L4 formed on the tenth dielectric layer M10 by way of the via conductor M10-9 also formed on the tenth dielectric layer M10. The other end of the part of the inductor L4 formed on the tenth dielectric layer M10 is connected to one of the opposite ends of the part of the inductor L4 formed on the eleventh dielectric layer M11 by way of the via conductor V11-9 also formed on the eleventh dielectric layer M11. The other end of the part of the inductor L4 formed on the eleventh dielectric layer M11 is connected to the common terminal T6.

The capacitors C2, C3 and C4 of the band pass filter of the lumped constant type having the first pass band are formed on the right half of the twelfth dielectric layer M12 and also on the right half of the thirteenth dielectric layer M13. One of the electrodes of the capacitor C2 and the corresponding one of the electrodes of the capacitor C3, the capacitors C2 and C3 being formed on the twelfth dielectric layer M12, are commonly connected. The electrode of the capacitor C4 formed on the twelfth dielectric layer M12 is connected to the connection point of the inductors L3 and L4 formed on the sixth dielectric layer M6 by way of the via conductors V12-3, V11-3, V10-3, V9-3, V8-3 and V7-3 and also to the site P2-3 of the electrode of the capacitor C5 formed on the second dielectric layer M2 by way of the via conductors V6-3, V5-3, V4-3 and V3-3. The other electrode of the capacitor C2 formed on the thirteenth dielectric layer M13 is connected to the low-frequency side terminal T4 and the other electrodes of the capacitors C3 and C4 formed on the thirteenth dielectric layer M13 are connected to each other.

In this embodiment, an inductor L7 is formed on the left halves of the sixth dielectric layer M6 and the seventh dielectric layer M7 to by turn form parallel resonator along with the capacitor C6 of the band pass filter of the distributed constant type having the second pass band. More specifically, a U-shaped element that takes part of the inductor L7 is formed on each of the sixth dielectric layer M6 and the seventh dielectric layer M7 and one of the opposite ends of the part of the inductor L7 formed on the sixth dielectric layer M6 is connected to the common terminal T6, while the other end thereof is connected to one of the opposite ends of the part of the inductor L7 formed on the seventh dielectric layer M7 by way of the via conductor V7-12 formed on the seventh dielectric layer M7. The other end of the part of the inductor L7 formed on the seventh dielectric layer M7 is connected to the via conductor V7-5 formed also on the seventh dielectric layer M7. The inductor L7 that forms a parallel resonator with the capacitor C6 is formed in this way. The inductor L7 may alternatively be made to have a bent section showing a U-shaped profile, a meandering profile or an arc-shaped profile instead of a spiral profile.

As shown in FIG. 8, a grounding electrode G13 is formed on the left half of the thirteenth dielectric layer M13 in a region that contains the via conductors V13-4 and V13-5 and connected to the grounding terminals T1 and T3.

A conductive material is arranged in the through holes (via holes) formed in the dielectric layers to form via conductors that operate as conductive paths electrically connecting the dielectric layers. The via conductors V3-5 through V13-5 form resonance elements R11 and R12 of the band pass filter of the distributed constant type having the second pass band, while the via conductors V3-4 through V13-4 form resonance elements R21 and R22 of the band pass filter of the distributed constant type having the second pass band.

FIG. 9 illustrates an equivalent circuit of the diplexer having the above-described configuration. In FIG. 9, M denotes the inductive coupling of the resonance elements R11 and R21 and that of the resonance elements R12 and R22, the magnitude of which can be defined by the gap separating the resonance elements. In this embodiment again, the circuit including the inductor L2 in the band pass filter of the lumped constant type can be formed as series resonator. Additionally, the circuit including the capacitor C10 can be formed as parallel resonator.

What is claimed is:

1. A diplexer comprising:
   a first filter having a first pass band; and
   a second filter having a second pass band with a center frequency at least twice as high as the center frequency of the first pass band; wherein
   the first filter is a filter of a lumped constant type;
   wherein the second filter is a band pass filter of a distributed constant type and comprises a resonator formed in a multilayer substrate that includes an inductor made of a linked via conductor formed along a laminating direction of the multilayer substrate and an electrode capacitive-coupled to a grounding electrode; and
   wherein the resonator of the second filter includes an inductor electrode having a bent section.

2. The diplexer according to claim 1, wherein the first filter of the lumped constant type having the first pass band is a band pass filter formed by connecting a low pass filter and a high pass filter in series.

3. The diplexer according to claim 1, wherein the inductor electrode having the bent section has a profile at least selected from a spiral profile, a U-shaped profile, a meandering profile and an arc-shaped profile.

4. The diplexer according to claim 1, wherein the second filter of the distributed constant type having the second pass band is capacitive-coupled to a common terminal.

5. The diplexer according to claim 1, wherein the second filter of the distributed constant type having the second pass band is connected to a common terminal by way of an LC parallel resonance circuit.

6. The diplexer according to claim 1, wherein the resonator of the second filter of the distributed constant type having the second pass band is connected to a short circuit terminal formed at a side of the surface located vis-à-vis a mounting surface of the multilayer substrate.

7. The diplexer according to claim 1, wherein the inductor in the resonator of the second filter is connected to the electrode capacitive-coupled to the grounding electrode.

8. The diplexer according to claim 1, wherein the inductor electrode in the resonator of the second filter is connected to the inductor and the electrode capacitive-coupled to the grounding electrode.

9. The diplexer according to claim 1, wherein the first filter of the lumped constant type having the first pass band is connected to a common terminal by way of an inductor electrode.

10. A diplexer comprising:
    a first filter having a first pass band; and
    a second filter having a second pass band with a center frequency at least twice as high as the center frequency of the first pass band; wherein
    the first filter is a filter of a lumped constant type;
    wherein the second filter is a band pass filter of a distributed constant type and comprises a resonator formed in a multilayer substrate that includes an inductor made of a linked via conductor formed along a laminating direction of the multilayer substrate and an electrode capacitive-coupled to a grounding electrode; and
    wherein the second filter of the distributed constant type having the second pass band is connected to a common terminal by way of an LC parallel resonance circuit.

11. A diplexer comprising:
    a first filter having a first pass band; and
    a second filter having a second pass band with a center frequency at least twice as high as the center frequency of the first pass band; wherein
    the first filter is a filter of a lumped constant type;
    wherein the second filter is a band pass filter of a distributed constant type and comprises a resonator formed in a multilayer substrate that includes an inductor made of a linked via conductor formed along a laminating direction of the multilayer substrate and an electrode capacitive-coupled to a grounding electrode; and
    wherein the resonator of the second filter of the distributed constant type having the second pass band is connected to a short circuit terminal formed at a side of the surface located vis-à-vis a mounting surface of the multilayer substrate.

* * * * *